(12) United States Patent
Masahiro

(10) Patent No.: US 6,437,646 B2
(45) Date of Patent: Aug. 20, 2002

(54) VARIABLE GAIN AMPLIFIER CIRCUIT AND GAIN CONTROL METHOD

(75) Inventor: Fujii Masahiro, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/947,170

(22) Filed: Sep. 4, 2001

Related U.S. Application Data

(63) Continuation of application No. 09/395,542, filed on Sep. 14, 1999.

(30) Foreign Application Priority Data

Sep. 16, 1998 (JP) .......................................... 10-260734

(51) Int. Cl.$^7$ ................................................ H03G 3/30
(52) U.S. Cl. ........................................ 330/284; 330/285
(58) Field of Search ................................. 330/279, 284, 330/285

(56) References Cited

U.S. PATENT DOCUMENTS 6,147,568 A * 11/2000 Souetinov ............... 330/284 X
6,351,188 B1 * 2/2002 Masahiro ................... 330/284

* cited by examiner

Primary Examiner—Steven J. Mottola
(74) Attorney, Agent, or Firm—Dickstein, Shapiro, Morin & Oshinsky, LLP.

(57) ABSTRACT

A variable gain amplifier circuit includes an emitter-grounded amplifier circuit and an emitter follower connected to the input section of the emitter-grounded amplifier circuit and having a variable output impedance. In a gain control method for the variable gain amplifier circuit, a bias voltage applied to the input section of the emitter-grounded amplifier circuit is kept constant, and the output impedance of the emitter follower is changed in a direction in which the gain of the emitter-grounded amplifier circuit decreases.

31 Claims, 7 Drawing Sheets

VARIABLE GAIN AMPLIFIER CIRCUIT AND GAIN CONTROL METHOD

CROSS REFERENCE TO RELATED APPLICATIONS

This is a continuation of U.S. patent application Ser. No. 09/395,542 filed Sep. 14, 1999 in the name of Fujii Masahiro and entitled VARIABLE GAIN AMPLIFIER CIRCUIT AND GAIN CONTROL METHOD.

BACKGROUND OF THE INVENTION

1. Field of the Invention

The present invention relates to a variable gain amplifier circuit and gain control method and, more particularly, to a variable gain amplifier circuit and gain control method which are used for the receiving section of a portable telephone terminal.

2. Description of the Prior Art

Recently, the portable telephone market has rapidly developed. In the receiving section of a portable telephone terminal, a weak RF signal received by an antenna is input first to a low-noise amplifier circuit to be amplified to a desired power, and then, only a desired frequency band is selected by a filter. The resultant signal is frequency-converted into an IF signal.

In a currently used digital portable telephone, to ensure a predetermined bit error rate, a circuit used for a receiving section is required to have a wide range of linearity because signals having various strengths can be received depending on the distance between the receiving section and a base station.

In order to ensure the linear operation of the circuit connected to the subsequent stage of the reception circuit, the above low-noise amplifier circuit is required to have a gain changing function by operating at a high gain with respect to a weak signal and decreasing the gain upon reception of a strong signal.

When a silicon bipolar transistor is used for this variable gain type low-noise amplifier circuit as in conventional terminals, the circuit uses two or more amplifiers and has a gain changing function after the second amplifier.

A heterojunction bipolar transistor (to be referred to as an HBT hereinafter), using a compound semiconductor such as GaAs, can be used for a portable telephone terminal as well.

This compound HBT has excellent RF characteristics, and hence a portable telephone low-noise amplifier circuit can be formed using only one amplifier. This component characteristic can decrease the number of elements used in constructing a portable telephone terminal. It is therefore expected that the reduction in number of components permits reduction in the area occupied by the circuit and power consumption.

Consider the circuit shown in FIG. 1 as a single-stage variable gain amplifier circuit using a bipolar transistor such as the compound HBT.

FIG. 1 is a circuit diagram showing a conventional variable gain amplifier circuit. This variable gain amplifier circuit is comprised of an npn transistor 51, a capacitor 52 and inductor 53 which are connected to the collector of the npn transistor 51, a capacitor 54 and inductor 55 which are connected to the base of the npn transistor 51, bias application terminals 56 and 57 each connected to the other terminal of a corresponding one of the inductors 53 and 55, an output terminal 58 connected to the other terminal of the capacitor 52, and an input terminal 59 connected to the other terminal of the capacitor 54.

This conventional circuit is an emitter-grounded amplifier circuit using the transistor 51, in which DC biases are applied to the base and collector of the transistor through the bias application terminals 56 and 57 and inductors 53 and 55, an input signal input through the input terminal 59 is input to the base of the transistor 51 through the DC blocking capacitor 54 current, and an output signal output from the collector of the transistor 51 is output from the output terminal 58 through the DC blocking capacitor 52.

In general, an LC impedance matching circuit is often connected to the input/output section, although this circuit is omitted in this case.

In a bipolar transistor, the transconductance (gm) of the elements changes in accordance with the base bias, and the gain approximates gm·ZL where ZL is the load impedance. Therefore, by using the bias application terminal 57 as a gain control terminal and changing the voltage to be applied, this circuit can be used as a variable gain amplifier circuit.

Other variable gain amplifier circuits of this type are disclosed in Japanese Unexamined Patent Publication Nos. 10-93390, 62-188411, 57-147309, and 57-132410 (to be referred to as references 1 to 4, respectively, hereinafter).

The problem in the conventional variable gain amplifier circuit shown in FIG. 1 is that a third-order input intercept point (to be referred to as an IIP3 hereinafter) decreases with a decrease in gain, as indicated by the graph shown in FIG. 2 which shows the gain dependence of the IIP3 of the conventional circuit.

This is because, when a low base bias is set for a low gain, the difference between the base bias and the base ON voltage becomes small which increases the nonlinearity of the current/voltage characteristics between the base and the emitter, thereby readily distorting the input waveform.

In the receiving section of a portable telephone, low-gain operation is performed upon reception of a strong signal, and hence a larger IIP3 is required in low-gain operation than in high-gain operation. For this reason, in order to apply this circuit to a portable telephone; the IIP3 must be increased in low-gain operation.

Japanese Unexamined Patent Publication No. 6-78241 (to be referred to as reference 5 hereinafter) discloses an automatic gain control circuit for controlling the gain of a variable gain amplifier 5 by using an emitter follower 20.

In this circuit, however, since the base bias voltage of the variable gain amplifier 5 is controlled by the emitter follower 20, the IIP3 undesirably decreases as in the conventional circuit described above.

The automatic gain control circuit in reference 5 is used for a satellite broadcasting receiver. In this regard as well, this conventional circuit differs from the present invention.

SUMMARY OF THE INVENTION

The present invention has been made in consideration of the above drawbacks of the prior art, and has as its object to provide a variable amplifier circuit and gain control method which can increase IIP3 in low-gain operation.

In order to achieve the above object, according to the first aspect of the present invention, there is provided a variable amplifier circuit comprising signal amplification means and variable impedance means connected to an input section of the signal amplification means and having a variable output impedance.

According to the first aspect, gain control is performed by the fact that the variable impedance means changes the input impedance of the signal amplification means. That is, gain control is performed without changing the input-side bias voltage of the signal amplification means, and hence the IIP3 can be increased in low-gain operation. In other words, linearity is maintained even in low-gain operation.

This arrangement permits linearity to be maintained because an emitter follower is connected in parallel with the input terminal of an emitter-grounded amplifier, and the emitter follower is used to control the power input to the emitter-grounded amplifier circuit so as to prevent a deterioration in the distortion characteristics of the emitter-grounded amplifier circuit.

According to the second aspect of the present invention, there is provided a gain control method for a variable gain amplifier circuit including signal amplification means and variable impedance means connected to an input section of the signal amplification means and having a variable output impedance, comprising the first step of keeping a bias voltage applied to the input section of the signal amplification means constant, and the second step of changing an output impedance of the variable impedance means. in a direction in which a, gain of the signal amplification means decreases.

The second aspect has the same effects as those of the first aspect.

In the present invention, an emitter-grounded amplifier circuit is used as the, signal amplification means, and an emitter follower is used as the variable impedance means.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF PREFERRED EMBODIMENTS

An outline of the present invention will be described first. Letting ZS be the impedance connected to the base of a transistor forming an emitter follower, letting gm be the transconductance of the transistor, and letting p be the current amplification factor, an output impedance Z of the emitter follower is given by $$Z=(1/gm)+ZS/(1+\beta) \tag{1}$$

When the base is controlled by a lower-impedance power supply, ZS=0 can be assumed, and the output impedance becomes 1/gm.

Since the transconductance gm of the bipolar transistor exponentially changes iwith respect to the base voltage, the output impedance Z of the emitter follower can be greatly changed by changing the base voltage.

In the present invention, since this variable impedance emitter follower is connected in parallel with the input terminal of an emitter-grounded amplifier circuit, when the input impedance of a transistor for amplification (to be referred to as an amplification transistor hereinafter) is represented by Zi, the impedance viewed from the input terminal of the circuit is given by the parallel connection between Zi and 1/gm, and the power input to this transistor is 1/(1+ gm×Zi) of the total input power.

As described above, since the transconductance gm can be changed depending on the base voltage of the emitter follower, the input power to the amplification transistor can be controlled. This makes it possible to control the gain of the overall circuit.

In considering distortion characteristics, an output third-order intercept point (to be referred to as an OIP3 hereinafter) remains constant as long as the bias applied to the amplification transistor is constant.

If the gain of the variable gain amplifier circuit is represented by G, since IIP3=OIP3/G as long as the bias applied to the amplification transistor remains constant, the IIP3 can be increased when the gain G is decreased by controlling the base voltage of the emitter follower as in the present invention.

When the gain G is decreased by the present invention in the above manner, a variable gain amplifier circuit that can increase the IIP3 can be provided.

Figure 3:
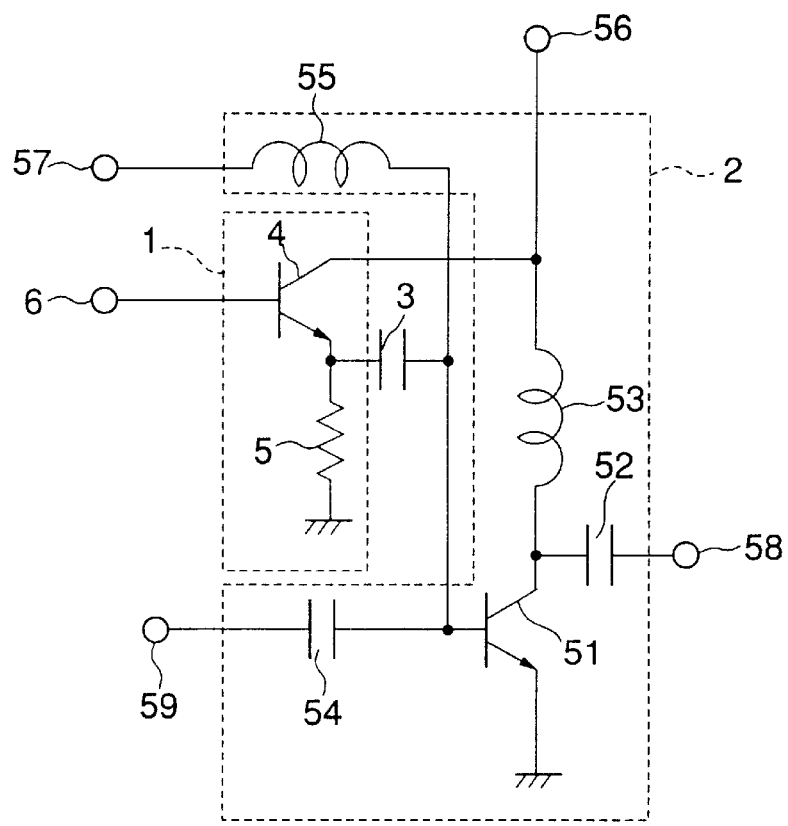
FIG. 3 is a circuit diagram showing a variable gain amplifier circuit according to the first embodiment of the present invention.

Several preferred embodiments of the present invention will be described below with reference to the accompanying drawings. FIG. 3 is a circuit diagram showing a variable gain amplifier circuit according to the first embodiment of the present invention. The same reference numerals as in this embodiment denote the same parts in the prior art (see FIG. 1), and a description thereof will be omitted.

Referring to FIG. 3, the variable gain amplifier circuit is comprised of an emitter follower 1, emitter-grounded amplifier circuit 2, and DC blocking capacitor 3 for coupling the output terminal of the emitter follower 1 to the input terminal of the emitter-grounded amplifier circuit 2.

The emitter follower 1 is made up of an npn transistor 4, a resistor 5 connected between the emitter and ground of the transistor 4, and a gain control terminal 6 connected to the base of the npn transistor 4.

The collector of the transistor 4 is connected to an inductor 53 with a bias application terminal 56.

One terminal of the capacitor 3 is connected to the emitter of the npn transistor 4, and the other terminal of the capacitor 3 is connected to the base of a transistor 51.

Since the arrangement of the emitter-grounded amplifier circuit 2 is the same as that in the prior art, a description thereof will be omitted.

A constant voltage is applied to the bias application terminal 57. That is, the base bias voltage of the transistor 51 is kept constant.

In this case, the base of the transistor 4 of the emitter follower 1 is used as the gain control terminal 6, and this transistor is made to operate as a variable gain amplifier.

The operation of the first embodiment will be described next. The first embodiment is based on the assumption that the impedance connected to the base of the transistor 4 of the emitter follower 1 can be regarded as approximately 0.

As described above, therefore, the output impedance of the emitter follower 1 is approximately $1/gm$, and is greatly changed in accordance with the base bias, i.e., the voltage applied to the gain control terminal 6.

An input circuit for a variable amplifier in the present invention is formed by parallel-connecting the output impedance Z of the emitter follower 1 to the input impedance Zi of the emitter-grounded amplifier circuit 2. Hence, the input power to the emitter-grounded amplifier circuit 2 changes in accordance with the relationship $1/(1+ gm \times Zi)$.

The output voltage on terminal 58 increases by a constant gain GE of the emitter-grounded amplifier circuit 2, but changes with a change in input power. The circuit in FIG. 3 therefore operates as a variable gain amplifier.

The base bias voltage of the transistor 51 of the emitter-grounded amplifier circuit 2 is kept constant. The OIP3 of the emitter-grounded amplifier circuit 2 is therefore kept constant.

Letting G be the gain of the overall circuit, IIP3=OIP3/G. That is, the IIP3 can be increased with a decrease in gain.

Figure 4:
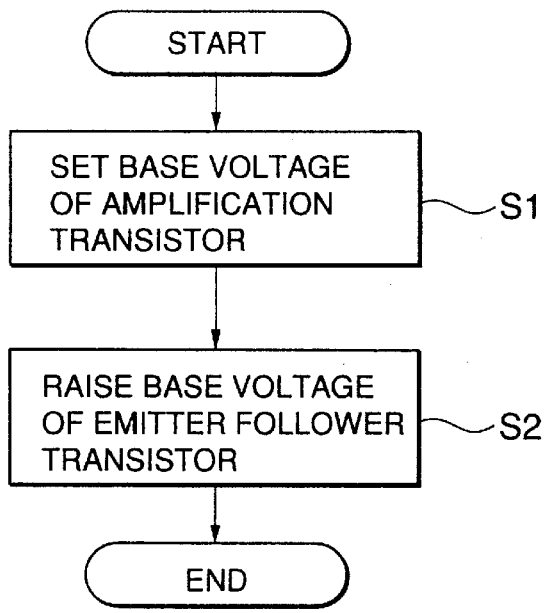
FIG. 4 is a flow chart showing the operation of the first embodiment in FIG. 3.

FIG. 4 is a flow chart showing the operation of the first embodiment. The operation of the first embodiment will be described with reference to this flow chart.

First of all, the base bias voltage of the amplification transistor 51 is kept constant (step S1). The base voltage of the emitter follower transistor 4 is raised (step S2). The operation is terminated here.

Figure 5:
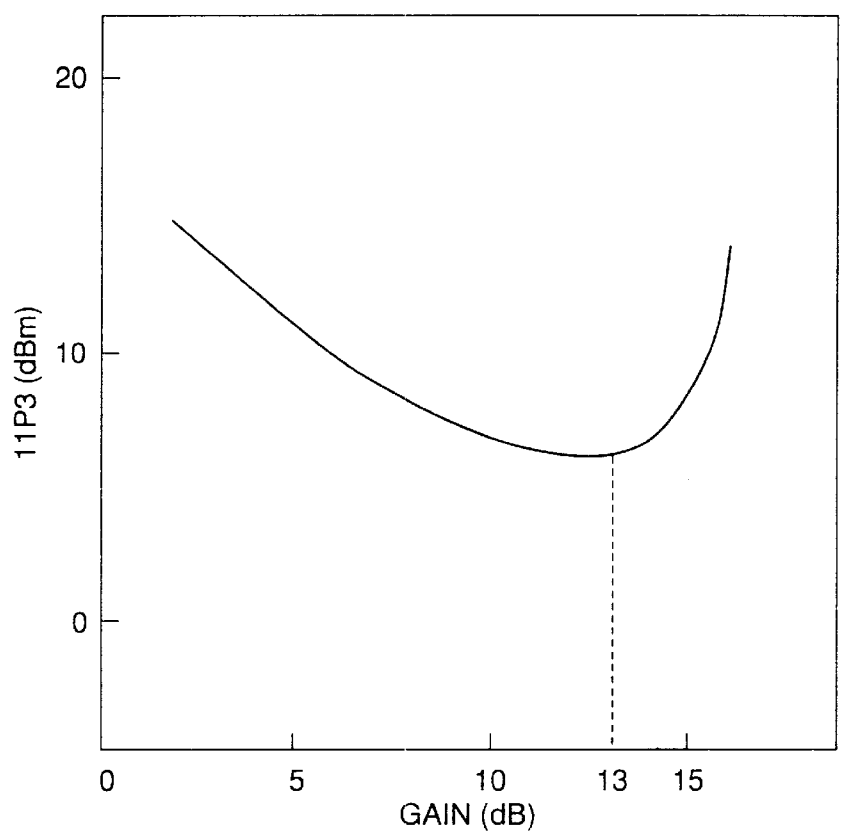
FIG. 5 is a graph showing the gain dependence of the IIP3 in the first embodiment.

FIG. 5 is a graph showing the gain (GAIN) dependence of the IIP3 in the first embodiment. FIG. 5 is a graph showing the relationship between the IIP3 and gain (GAIN) when the control voltage is changed from 1.5 V to 3 V while the power supply voltage is kept at 3 V.

The IIP3 increases with a decrease in gain in a range below a gain of 13 dBm. This indicates that the present invention can realize a variable gain amplifier circuit capable of increasing the IIP3 even in low-gain operation.

Figure 6:
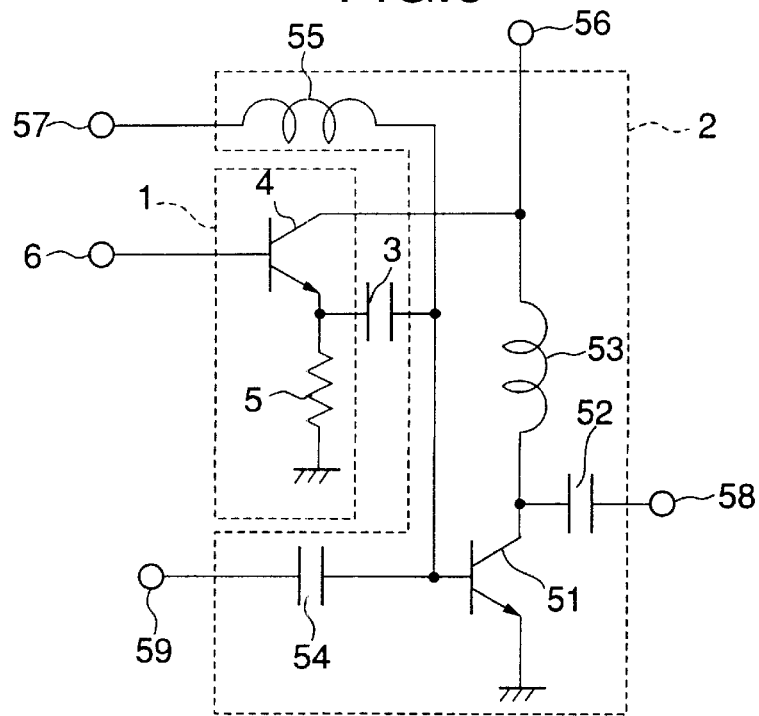
FIG. 6 is a circuit diagram showing a variable gain amplifier circuit according to the second embodiment of the present invention.

The second embodiment will be described next. FIG. 6 is a circuit diagram showing the second embodiment.

The arrangement of the second embodiment is the same as that of the first embodiment described above, and hence a description of the circuit will be omitted.

This embodiment is the same as the first embodiment in that the impedance connected to the base of a transistor of an emitter follower 1 can be regarded as approximately 0. However, the second embodiment differs from the first embodiment in that a base bias terminal 57 of an emitter-grounded amplifier circuit 2 is also used as a gain control terminal.

More specifically, the base of the transistor 4 of the emitter follower 1 is used as a first gain control terminal 6. The base bias terminal 57 connected to the base of a transistor 51 of the emitter-grounded amplifier circuit 2 through a capacitor 54 is used as the second gain control terminal, thereby making this circuit operate as a variable gain amplifier.

The operation of the second embodiment will be described next. As described above, the output impedance of the emitter follower 1 is approximately $1/gm$, and is greatly changed by changing the base bias, i.e., the voltage applied to the first gain control terminal 6.

An input circuit for a variable amplifier in the present invention is formed by parallel-connecting the output impedance of the emitter follower 1 to an input impedance Zi of the emitter-grounded amplifier circuit 2. Hence, the input power to the emitter-grounded amplifier circuit 2 changes in accordance with the relationship $1/(1+ gm \times Zi)$.

The output voltage on terminal 58 increases by a constant gain GE of the emitter-grounded amplifier circuit 2, but changes with a change in input power. The circuit in FIG. 6 therefore operates as a variable gain amplifier.

In addition, according to the second embodiment, the base bias terminal of the emitter-grounded amplifier circuit 2 is also used as the second gain control terminal 57.

When the OIP3 of the emitter-grounded amplifier circuit 2 remains constant, since IIP3=OIP3/G where G is the gain of the overall circuit, the IIP3 can be increased with a decrease in gain.

Figure 7:
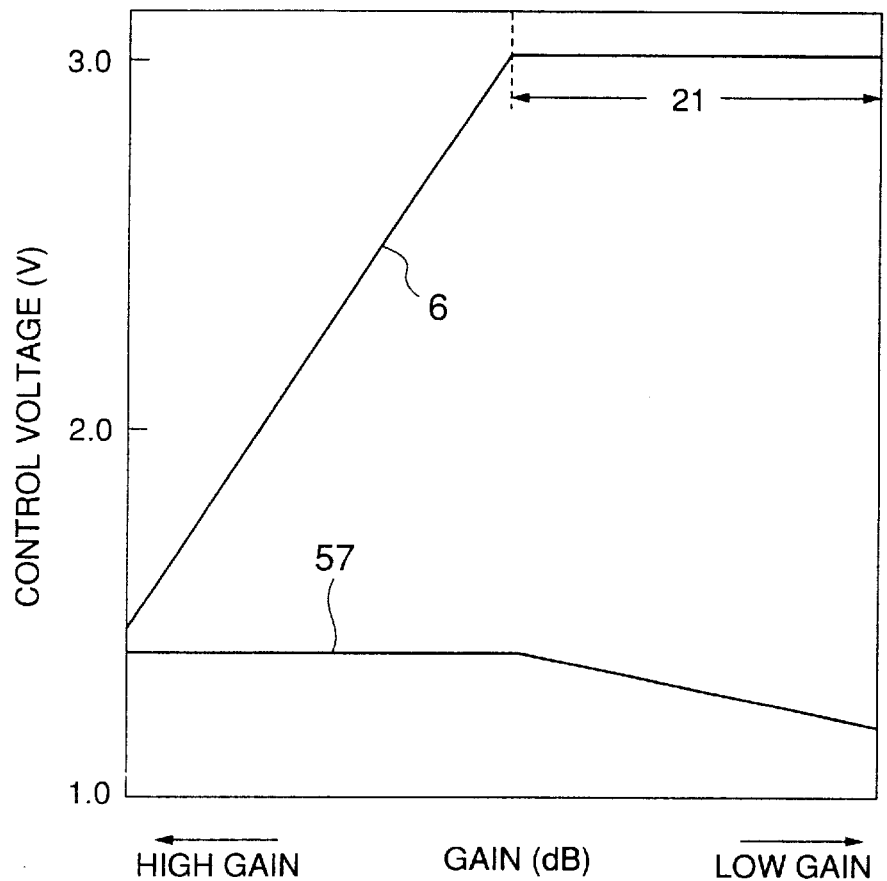
FIG. 7 is a graph showing gain/control voltage characteristics in the second embodiment in FIG. 2.

FIG. 7 is a graph showing the gain/control voltage characteristics to explain the operation of the second embodiment. FIG. 7 shows a control voltage application method in the second embodiment. In this method, the base voltage of the emitter-grounded amplifier circuit 2, as the second control terminal 57, is controlled only within a low-gain, high-IIP3 region 21, in which the base voltage of the emitter follower 1, as the voltage at the first control terminal 6, is set to be high, thereby decreasing the gain while keeping the high IIP3 .

In the second embodiment, the gain control range can be expanded on the low-gain side while the IIP3 is kept high, as compared with the first embodiment.

Figure 8:
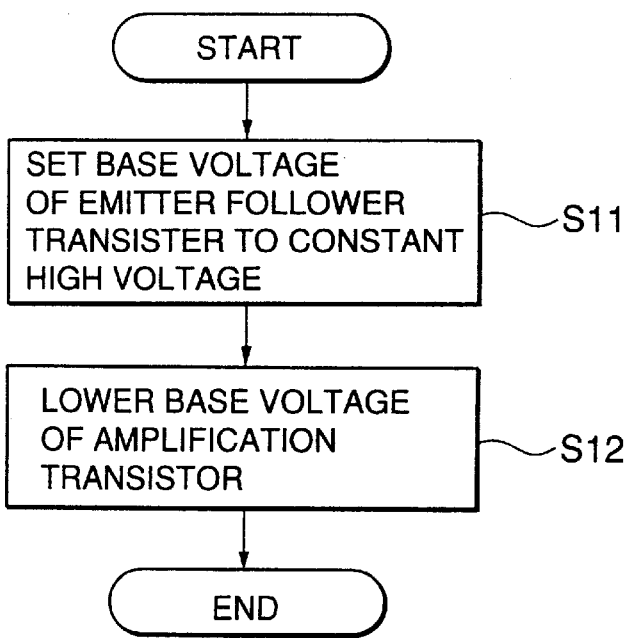
FIG. 8 is a flow chart showing the operation of the second embodiment.

FIG. 8 is a flow chart showing the operation of the second embodiment. The operation of the second embodiment will be described with reference to this flow chart.

First of all, the base voltage of the emitter follower transistor 4 is kept high (step S11). The base bias voltage of the amplification transistor 51 is then lowered (step S11). The operation is terminated here.

Figure 9:
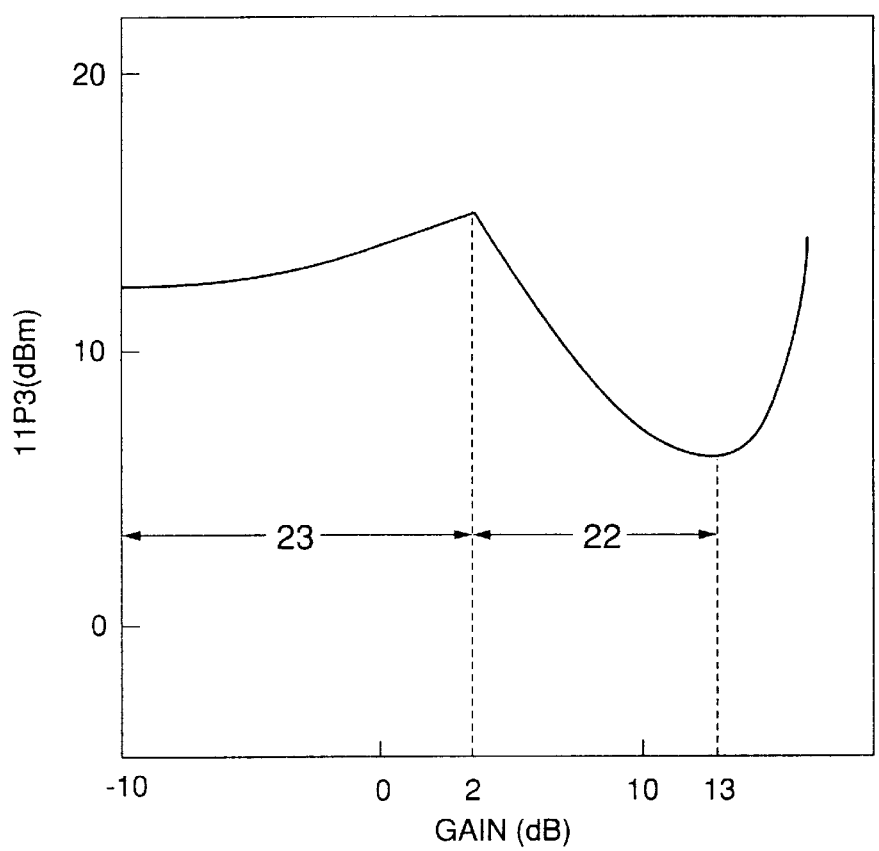
FIG. 9 is a graph showing the gain dependence of the IIP3 in the second embodiment.

FIG. 9 is a graph showing the gain (GAIN) dependence of the IIP3 in the second embodiment.

In a range 22 from a gain of 13 dB to a gain of 2 dB, the voltage at the first control terminal 6 is controlled, and the IIP3 can be increased with a decrease in gain.

In a range 23 below a gain of 2 dB or less, the voltage at the second control terminal 57 is changed, and the gain can be changed to a lower gain while the IIP3 value is substantially maintained at a high value.

The circuit arrangement of the third embodiment is the same as that of the second embodiment. The third embodiment differs from the second embodiment in the control voltage application method.

Similarly to the first and second embodiments, the third embodiment is based on the assumption that the impedance connected to the base of a transistor 4 of an emitter follower 1 can be regarded as approximately 0.

Figure 10:
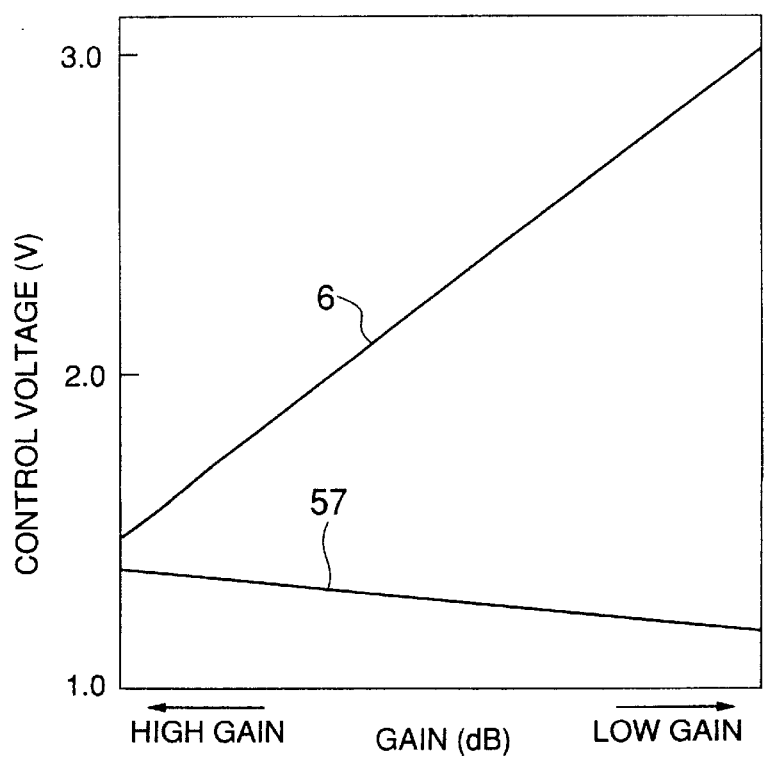
FIG. 10 is a graph showing gain/control voltage characteristics in the third embodiment of the present invention.

FIG. 10 is a graph showing gain/control voltage characteristics to explain the operation of the third embodiment. FIG. 10 shows the control voltage application method in the third embodiment. In this method, the gain is decreased by raising the voltage at a first gain control terminal 6 and lowering the voltage at a second control terminal 57 at the same time.

According to the third embodiment, a decrease in IIP3 with a decrease in the gain at the second control terminal 57 is compensated by an increase in IIP3 upon a decrease in the gain at the first control terminal 6, thereby suppressing a decrease in IIP3.

Figure 1:
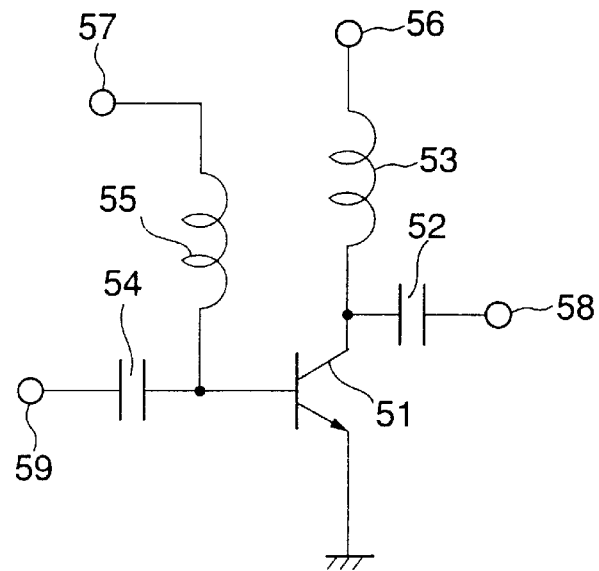
FIG. 1 is a circuit diagram showing an example of a conventional variable gain amplifier circuit.

A large IIP3 can be obtained in all the gain range as compared with the prior art shown in FIG. 1.

Figure 11:
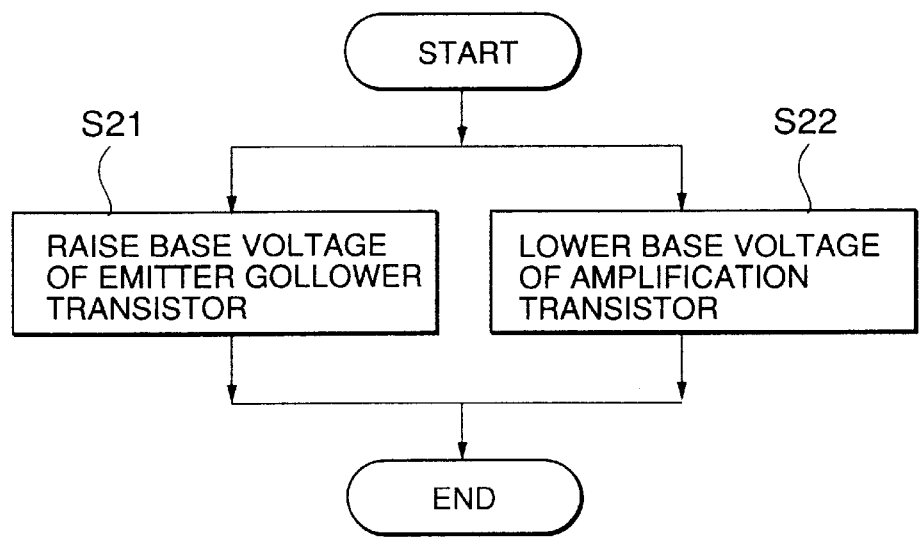
FIG. 11 is a flow chart showing the operation of the third embodiment.

FIG. 11 is a flow chart showing the operation of the third embodiment. The operation of the third embodiment will be described with reference to this flow chart.

A process (step S21) of raising the base voltage of the emitter follower transistor 4 and a process (step S22) of lowering the base bias voltage of an amplification transistor 51 are performed at the same time. The operation is terminated here.

Figure 2:
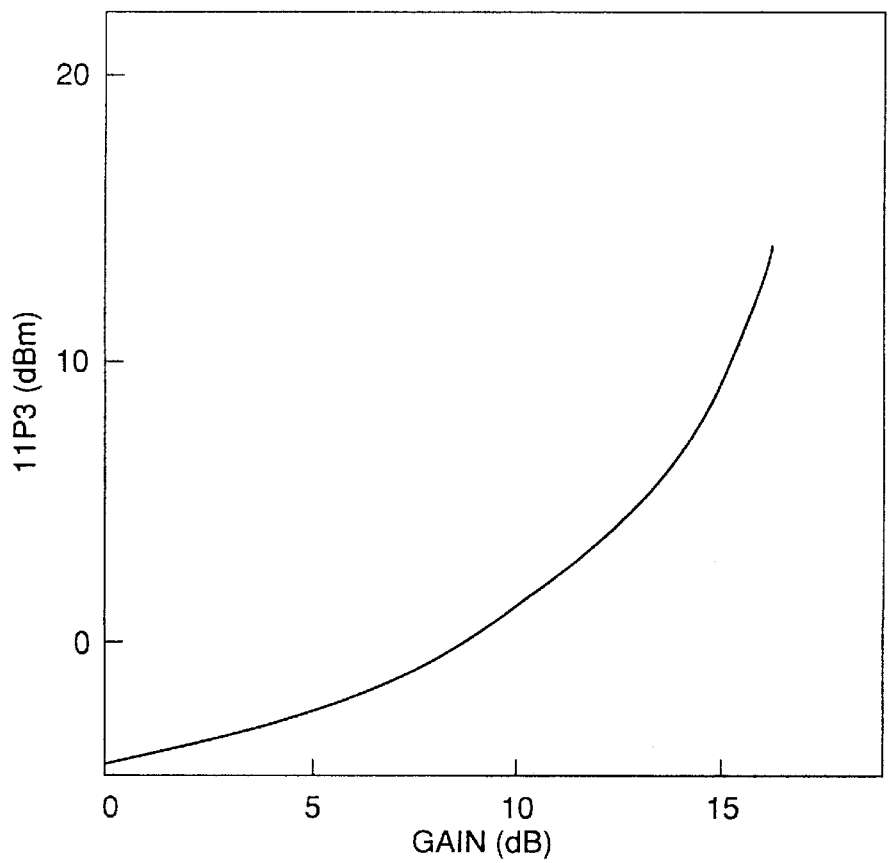
FIG. 2 is a graph showing the gain dependence of the third-order input intercept point in the prior art.
Figure 12:
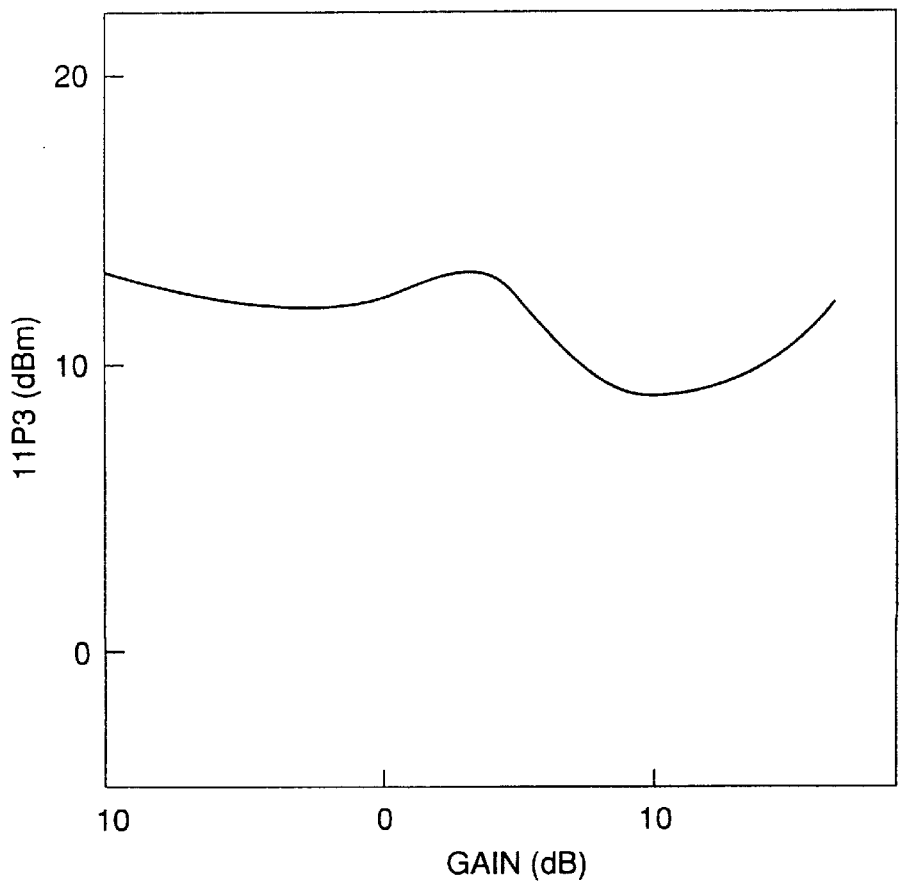
FIG. 12 is a graph showing gain/control voltage characteristics of the IIP3 in the third embodiment.

FIG. 12 is a graph showing the gain (GAIN) dependence of the IIP3 in the third embodiment. As is obvious from FIG. 12, a large IIP3 can be maintained as compared with the corresponding value in FIG. 2 in the prior art, and the difference between these values is noticeable especially in a low-gain region.

Figure 13:
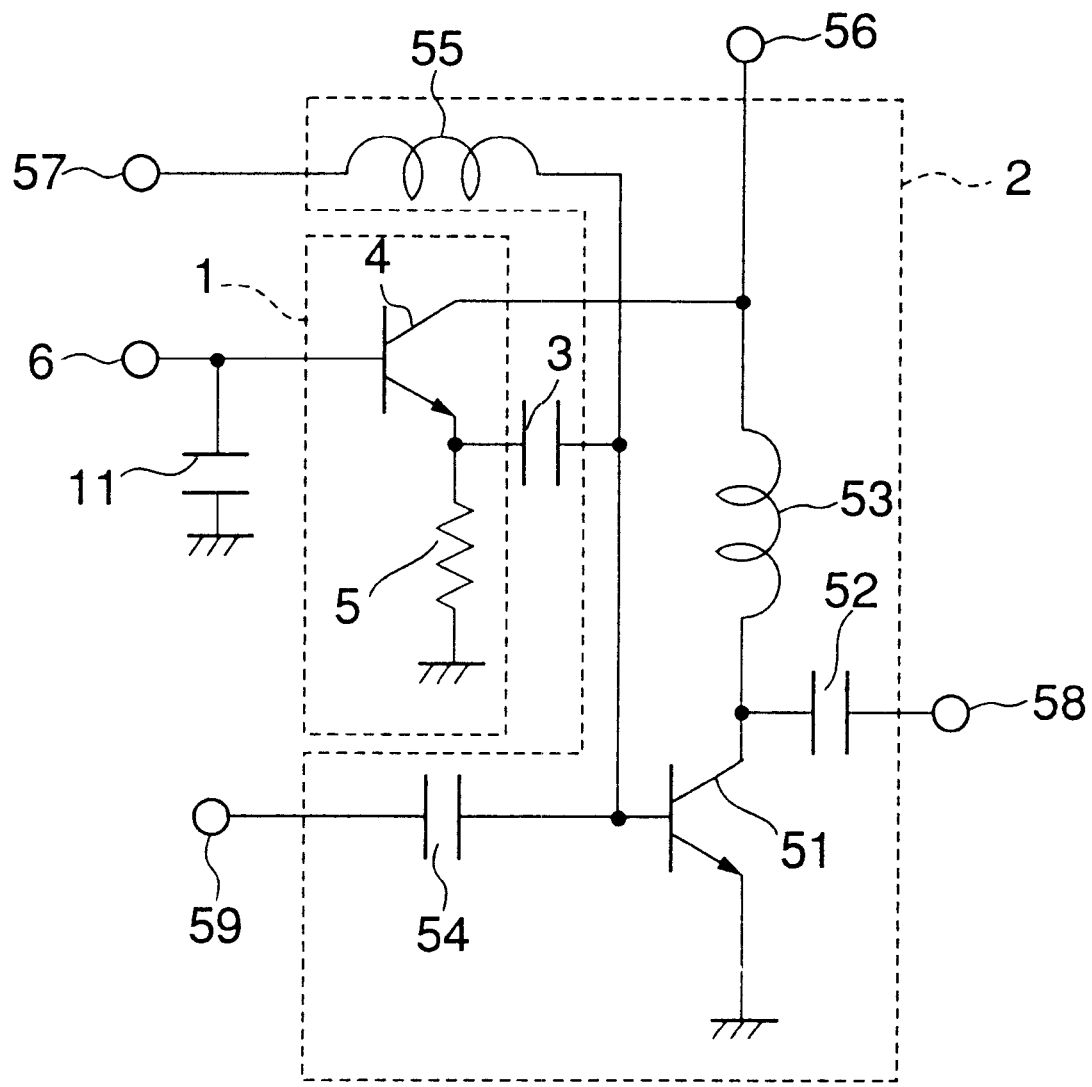
FIG. 13 is a circuit diagram showing a variable gain amplifier circuit according to the fourth embodiment of the present invention.

FIG. 13 is a circuit diagram showing the fourth embodiment. The arrangement of the fourth embodiment is almost the same as that of the second embodiment described above (see FIG. 6) except that a capacitor 11 is added between a first control terminal 6 and ground. When the output impedance of a circuit connected to the first control terminal 6 is high, in particular, the capacitor 11 decreases the output impedance, and a large IIP3 value can be obtained in a low-gain region, as in the first to third embodiments.

The same reference numerals as in FIG. 13 denote the same parts in the second embodiment (see FIG. 6), and a description thereof will be omitted.

The operation of the fourth embodiment will be described next. As described above, when the output impedance of a circuit connected to the first control terminal 6 is not low, the output impedance of an emitter follower 1 does not become 1/gm but becomes the relationship given by equation (1). However, the addition of the capacitor 11 decreases the high-frequency impedance of the input to restore the output impedance to 1/gm. This makes it possible to obtain a large IIP3 value on the low-gain side even if gain control is performed by a circuit having a high output impedance.

According to the above description, the capacitor 11 is added to the first control terminal 6 in the second embodiment. However, the same effect as described above can be obtained even if the capacitor 11 is added to each of the first to third embodiments.

The first to fourth embodiments have exemplified the variable gain amplifiers using bipolar transistors. As is apparent, however, the present invention can be applied to amplifiers using FETs such as MESFETs, HEMTS, and JFETs because the transconductance gm of each transistor is changed by a gate bias.

What is claimed is:

1. A variable gain amplifier circuit exhibiting low distortion at low gain levels, the circuit comprising:
   a signal amplification device having an input section characterized by an input impedance;
   the signal amplification device being further characterized by a gain which is adjustable according to a control signal provided to said input section;
   a variable impedance device connected to said input section;
   said variable impedance device having a variable output impedance; and
   said variable output impedance being operative to vary an IIP3 exhibited by the signal amplification device inversely relative to the gain thereof, thereby contributing to linear operation of said signal amplification device.

2. A circuit according to claim 1, wherein said signal amplification device includes a voltage application device for applying a bias voltage to the input section.

3. A circuit according to claim 1, wherein said signal amplification device comprises an emitter-grounded amplification circuit.

4. A circuit according to claim 1, wherein said variable impedance device comprises an emitter follower.

5. A circuit according to claim 1, wherein an output impedance of said variable impedance device is 1/gm.

6. A method for controlling the gain of a variable gain amplifier circuit to maintain low distortion at low gain levels, the amplifier including a signal amplification device and a variable impedance device connected to an input section of said signal amplification device, said variable impedance device having a variable output impedance effective to modify an input impedance of said input section, said method comprising:
   changing at least one of a bias voltage applied to said input section and said output impedance of said variable impedance device to vary the IIP3 of said signal amplification device inversely in relation to the gain thereof.

7. A method according to claim 6, wherein said output impedance of said variable impedance device is 1/gm.

8. A method according to claim 6, wherein at least one of said output impedance and said bias voltage is maintained constant.

9. A variable gain amplifier circuit exhibiting low distortion at low gain levels, the circuit comprising:
   a common emitter signal amplifier having an input section, and a gain which varies according to a control signal provided to said input terminal;
   an emitter follower circuit effective to provide variable impedance;
   an output of said emitter follower circuit being capacitively coupled to said input section; and
   said emitter follower circuit being operable to vary an IIP3 exhibited by the signal amplifier inversely relative to the gain, thereby contributing to linearity of said common emitter signal amplifier.

10. A variable gain amplifier circuit according to claim 9, further comprising a bias voltage input connected to said input section.

11. A variable gain amplifier circuit according to claim 10, further comprising another bias voltage input connected to a collector of both of said emitter follower circuit and said common emitter signal amplifier.

12. A variable gain amplifier circuit exhibiting low distortion at low gain levels, the circuit comprising:
   an amplifier;
   the amplifier being characterized by an input impedance at an input terminal thereof, and by a gain which varies according to a first control signal provided to said input terminal;
   an amplifier signal input circuit operative to connect an input signal to be amplified to the input terminal of the amplifier;
   a variable impedance device connected in parallel with said amplifier input circuit to said amplifier input terminal;
   said variable impedance device having a control terminal, and being characterized by an output impedance which varies according to a second control signal provided to the control terminal;

an output circuit that receives an amplified version of the input signal from said amplifier; and said variable output impedance being operative to vary an IIP3 exhibited by said amplifier inversely relative to the gain, thereby contributing to linear operation.

13. A circuit according to claim 12, wherein the output impedance of the variable impedance device is capacitively coupled to the input terminal of the amplifier.

14. A circuit according to claim 12, further including a biasing circuit that maintains a constant bias voltage at the input terminal of the amplifier.

15. A circuit according to claim 14, further including a capacitor coupled between the control terminal and ground.

16. A circuit according to claim 12, further including a first biasing circuit that provides a first adjustable bias voltage at the input terminal of the amplifier.

17. A circuit according to claim 16, further including a capacitor coupled between the control terminal and ground.

18. A circuit according to claim 17, further including a second biasing circuit that provides a second adjustable bias voltage to the control terminal;

the first and second bias voltages being unequal, and difference between the first and second bias voltages being greater for low gain levels of the amplifier than for high gain levels.

19. A circuit according to claim 17, further including a capacitor coupled between the control terminal and ground.

20. A circuit according to claim 12, further including a biasing circuit for providing a biasing voltage to the control terminal, the biasing circuit exhibiting a substantially zero output impedance.

21. A circuit according to claim 12, further including a source of a constant operating voltage for the amplifier and the variable impedance device.

22. A circuit according to claim 12, wherein the amplifier is a first transistor having a grounded emitter, a base connected to the input terminal thereof and a collector connected to the output circuit; and the variable impedance device is a second emitter follower transistor having an emitter capacitively coupled to the base of the first transistor.

23. A circuit according to claim 22, further including a biasing circuit that maintains a constant bias voltage at the base of the first transistor.

24. A circuit according to claim 23, further including a capacitor coupled between the base of the second transistor and ground.

25. A circuit according to claim 22, further including a first biasing circuit that provides a first adjustable bias voltage at the base of the first transistor.

26. A circuit according to claim 25, further including a capacitor coupled between the base of the second transistor and ground.

27. A circuit according to claim 25, further including a second biasing circuit that provides a second adjustable bias voltage to the base of the second transistor;

the first and second bias voltages being unequal, and difference between the first and second bias voltages being greater for low gain levels of the amplifier than for high gain levels.

28. A circuit according to claim 27, further including a capacitor coupled between the base of the second transistor and ground.

29. A circuit according to claim 22, further including a source of a constant operating voltage for the first and second transistors.

30. A circuit according to claim 22, further including a biasing circuit for the base of the second transistor, the biasing circuit exhibiting a substantially zero out put impedance.

31. A circuit according to claim 30, further including a capacitor coupled between the base of the second transistor and ground.

* * * * *